United States Patent [19]

Vannier et al.

[11] 4,093,873
[45] June 6, 1978

[54] COMPENSATING DIGITAL COUNTER FOR QUARTZ CRYSTAL OSCILLATOR

[75] Inventors: Jerald W. Vannier, Santa Clara; Gary T. Bastian, Cupertino, both of Calif.

[73] Assignee: Intel Corporation, Santa Clara, Calif.

[21] Appl. No.: 736,377

[22] Filed: Oct. 28, 1976

[51] Int. Cl.² ........................................... H03K 21/00
[52] U.S. Cl. ............................. 307/223 R; 58/23 R; 328/49; 328/63; 307/269; 331/51
[58] Field of Search ............... 307/221 C, 223, 269; 328/49, 63; 58/23 R, 23; 331/51, 1 A

[56] References Cited
U.S. PATENT DOCUMENTS

| | | | |
|---|---|---|---|
| 3,777,471 | 12/1973 | Koehler et al. | 58/23 R |
| 3,958,187 | 5/1976 | Suzuki et al. | 307/221 C |
| 4,009,445 | 2/1977 | Hasegawa | 58/23 R |
| 4,015,208 | 3/1977 | Hammer et al. | 58/23 R |
| 4,020,626 | 5/1977 | Kawabara et al. | 58/23 R |

Primary Examiner—Stanley D. Miller, Jr.
Assistant Examiner—B. P. Davis
Attorney, Agent, or Firm—Blakely, Sokoloff, Taylor & Zafman

[57] ABSTRACT

A programmable CMOS integrated circuit counter which compensates for fast or slow quartz crystal oscillators, particularly suited for watches. The circuit includes fuses which are programmed for a particular crystal; the programming is a function of the frequency deviation of the crystal oscillator from the standard frequency for that crystal oscillator. In the described watch circuit which employs a nominal 32,768hz crystal, compensation within ± 1ppm is obtained.

17 Claims, 5 Drawing Figures

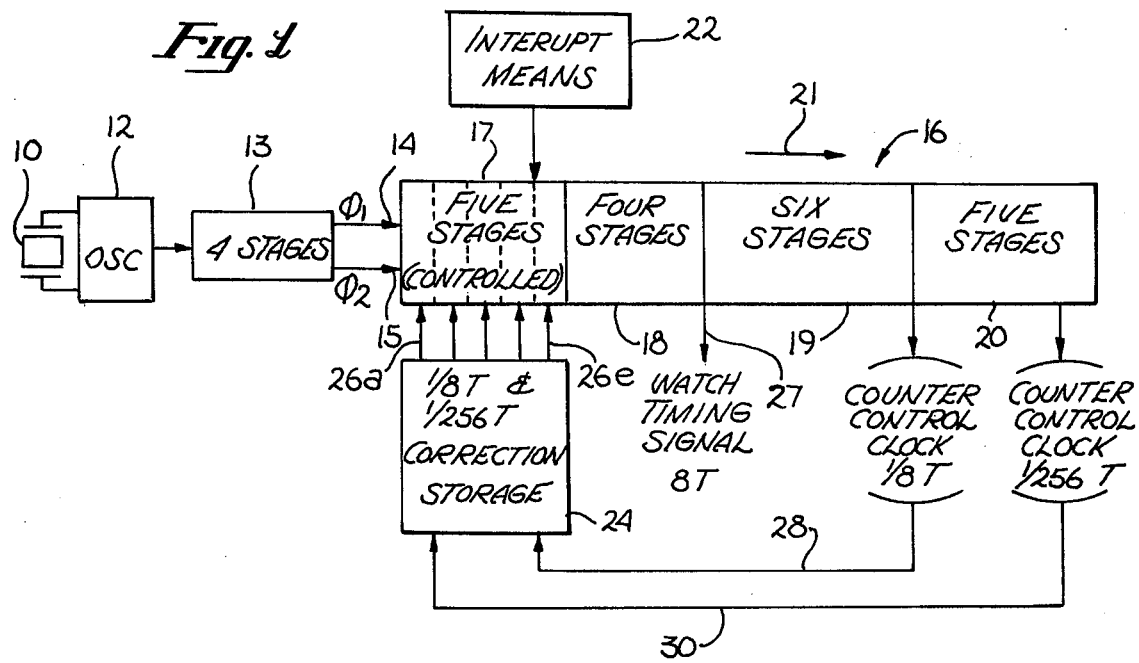
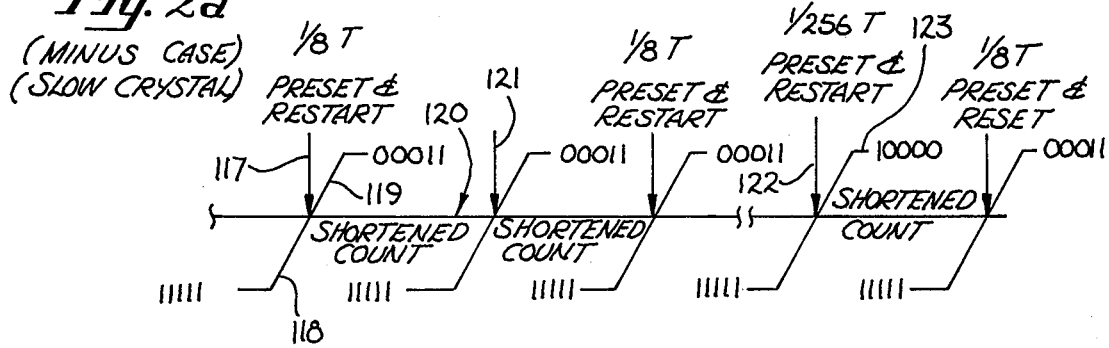
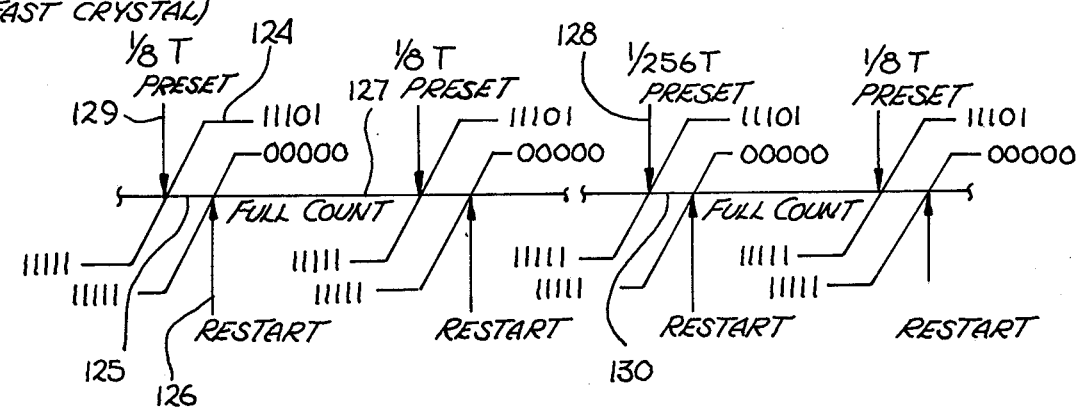

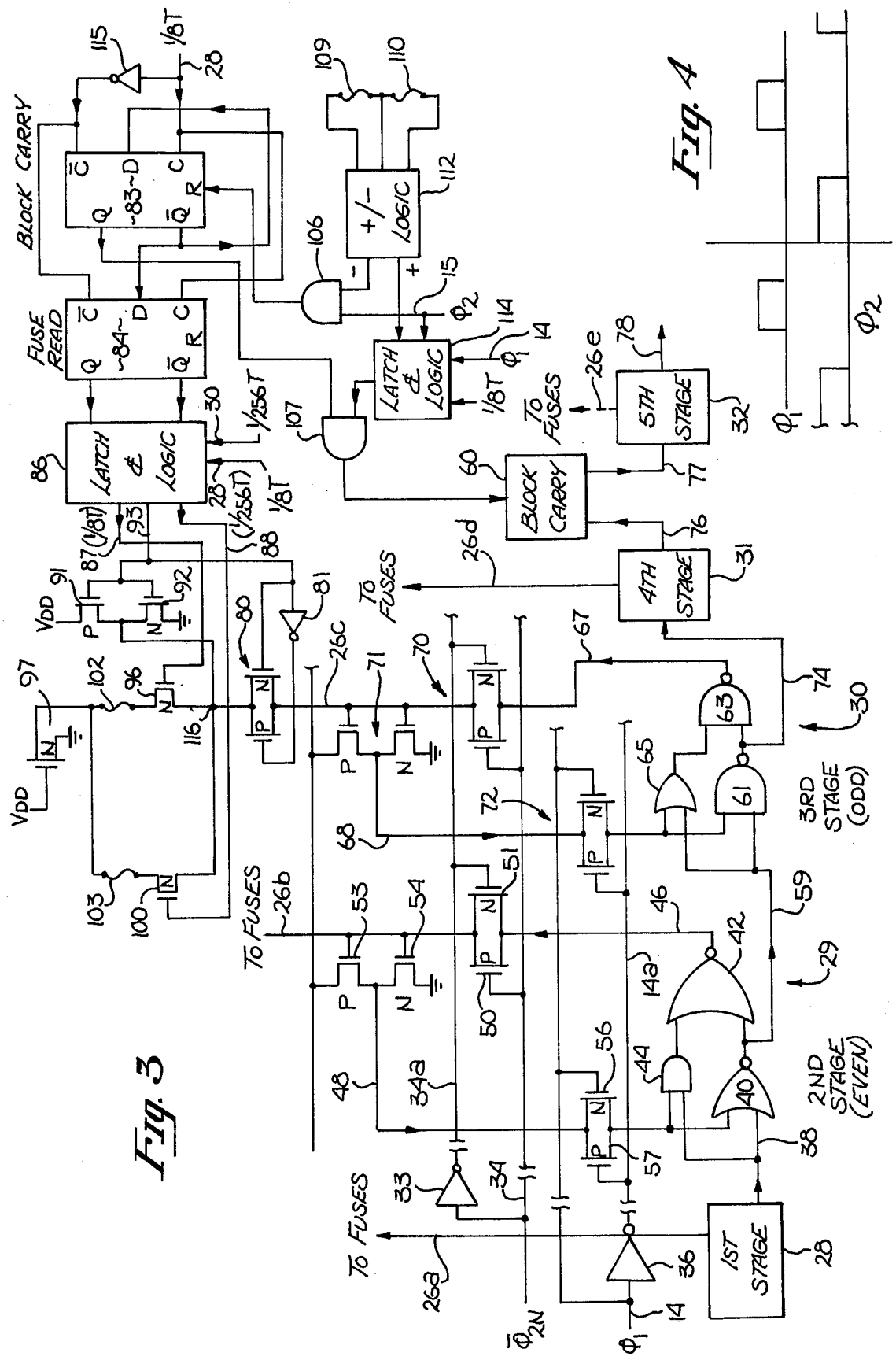

COMPENSATING DIGITAL COUNTER FOR QUARTZ CRYSTAL OSCILLATOR

BACKGROUND OF THE INVENTION

1. Field of the Invention

The invention relates to frequency dividers or counters which provide programmable compensation or adjustment for oscillators.

2. Prior Art

Quartz crystal oscillators are frequently employed as time standards in watches and chronometers. Generally an integrated circuit frequency divider or counter is employed to reduce the high frequency of the crystal oscillator to lower frequencies so that seconds, minutes, hours, etc., may be displayed. Since the frequency of most crystal oscillators deviates from the desired frequency some compensation is provided, particularly where greater accuracy is required. Often a trimming capacitor is employed with the crystal oscillator to provide this compensation. The capacitance of the trimming capacitor is adjusted to provide tuning of a given crystal. The compensation provided by these capacitors is unstable; and, in watch circuits where power consumption must be low, compensation can only be provided for a limited band of crystal oscillator frequency deviations. In contrast, with the disclosed counter, trimming capacitors are not required, thus the cost of the crystal oscillator is lower, in addition the oscillator power consumption may be reduced. Moreover, more accurate and more stable compensation is provided, and crystal oscillators with larger frequency deviations may be used, without loss of accuracy.

Compensating counters or dividers have been employed to correct crystal oscillator frequency deviations. In general, these devices either provide faster counting or suppress counts for compensation. One such circuit is described in U.S. Pat. No. 3,945,194. Also, in the prior art section of this patent, numerous other circuits are described.

With the invented programmable counter both "plus" and "minus" programming is possible, thus both fast or slow crystal oscillators may be employed. Additionally the described circuit may be readily expanded to correct the oscillator output to any desired degree of accuracy.

SUMMARY OF THE INVENTION

A digital counter for providing compensated timing signals is described. The counter employs a frequency reference source which is coupled to a plurality of counter stages for the purpose of reducing the frequency of the reference source to a lower frequency. Interrupt means are included for preventing the flow of signals in at least one of the counter stages. Also included are storage means for providing a predetermined digital number to a group of the counter stages. Control means for the counter which controls the interrupt means and storage means permits the count in the group of stages to be made a function of the stored predetermined number. The counter permits compensation for both a fast or a slow frequency reference source.

BRIEF DESCRIPTION OF THE DRAWINGS

FIG. 1 is a general block diagram of the disclosed counter.

FIG. 2a is a timing diagram used to describe the manner in which the count in certain stages of the counter is changed for a slow crystal (minus case).

FIG. 2b is a timing diagram used to describe the manner in which the count in certain stages of the counter is changed for a fast crystal (plus case).

FIG. 3 is a partial schematic of the counter of FIG. 1 which illustrates two dynamic counter stages, associated storage means and the control logic for the counter; and FIG. 4 is a graph illustrating the waveform of two timing signals employed by the counter.

DETAILED DESCRIPTION OF THE INVENTION

A digital counter for providing compensated timing signals, particularly suitable for a watch employing a quartz crystal oscillator is disclosed. In its presently preferred embodiment, the entire counter is fabricated as an integrated circuit with complementary, metal-oxide-semiconductor (CMOS) circuits employing polycrystalline silicon gates. However, it will be apparent that other fabrication technologies may be employed.

In the following description, some of the circuits have been simplified and shown in block diagram form in order not to obscure the inventive concepts in unnecessary details. It will be apparent to one skilled in the art that well-known circuits may be employed to implement those circuits represented in block diagram form. Also, circuits employed for testing and resetting the counter have not been shown, well-known circuits may be used for these functions. In the following description reference is made to specific details of the presently preferred embodiment, such as specific frequencies, circuits, etc., however, it will be obvious to one skilled in the art that the inventive concepts may be employed without use of such specific details.

Referring to FIG. 1, in its presently preferred embodiment the counter includes a total of 24 stages. As implemented this is the number of stages required to obtain a correction of ± 1ppm for a quartz crystal oscillator having a nominal frequency of 32,768hz. A quartz crystal 10 is used in a standard oscillator 12. The output of the oscillator 12 is used to drive a four stage static counting means 13. In the presently preferred embodiment, counting means 13 employs Johnson counters and divides the output of the oscillator 12 by a factor of eight. The output of means 13 consists of the signals $\phi_1$ (line 14) and $\phi_2$ (line 15). The waveforms for these signals are shown in FIG. 4. The $\phi_1$ and $\phi_2$ signals are used to drive the remaining stages shown as a separate counting means 16.

Counting means 16 which is coupled to lines 14 and 15, includes five "controlled" stages 17, four stages 18, six stages 19 and five stages 20. All of these stages, in the presently preferred embodiment, are dynamic stages which employ alternate odd and even logic. Two consecutive stages will be described in detail in conjunction with FIG. 3. It is apparent that as count accumulates within the counting means 16, the higher order count or more significant bits flow in the direction indicated by the arrows 21. Thus, by way of example, the six stages 19 include higher order bits than the five stages 17.

The output of the last stage of stages 18 in addition to being coupled to stages 19 is coupled to line 27. This signal has been designated as 8T. (In the present preferred embodiment, T=1/sec.) This 8hz signal is used by other watch circuitry for providing the display of seconds, hours, etc. It will be apparent that signals may be obtained at other points along the counting means 16 for providing other timing signals. The output of the six stages 19 (line 28) is used by the correcting or compensating circuitry; this signal has been designated as ⅛T. The output of the stages 20 (line 30) is also used by the correcting or compensating circuitry; this signal is designated as 1/256T.

The five stages 17 are controlled stages in that the count in these stages may be selectively changed. The correction storage means 24 is used to store digital numbers, which numbers are selectively communicated to the stages 17 on lines 26a through 26e. In general a binary-one or zero is placed within each stage 17 at a frequency of ⅛hz, however, at the end of every 256 second period an alternate number is coupled to the five stages 17.

The counter also includes interrupt means 22. The purpose of this means will be explained in more detail in conjunction with FIGS. 2b and 3. In general, this means prevents stages of counting means 16 from resetting, that is, changing from all binary-ones to all binary-zeros. In the presently preferred embodiment this is accomplished by blocking the carry from one stage to another.

The counter (including the correction storage means and interrupt means) may be employed to compensate the output of crystal oscillator 12 when the oscillator frequency is slower than the standard frequency for that oscillator. This is referred to as a "slow" crystal; for this case (minus case) as illustrated in FIG. 2a, shortened counting periods occur. The counter may also be employed to compensate the output of crystal oscillator 12 when the frequency of the oscillator is faster than the standard frequency, that is, a fast crystal. This is referred to as the plus case, as shown in FIG. 2b, since additional counting occurs. In its presently preferred embodiment, as will be described in more detail, fuses which are part of the integrated circuit are programmed such that the circuit performs either the plus or the minus correction.

Before describing the detailed embodiment of FIG. 3, the general operation of the counter for both the minus case and plus case shall be described in conjunction with FIGS. 2a and 2b, respectively.

Assume that all the stages of counting means 16 include binary-zeros, that is, the count of zero. (Note that because of the alternating odd and even logic employed within counting means 16 a binary-one in one stage is represented by a signal or presence of charge while in the next stage a binary-one is represented by the lack of a signal or the lack of charge.) The $\phi_1$ and $\phi_2$ timing signals cause the count to rise in an ordinary manner. Every time a binary-one is carried from stages 18 to stages 19 a watch timing signal occurs on line 27. The ⅛T signal occurs each time a binary-one is carried from the last stage of stages 19 to the first stage of stages 20. The 1/256T signal occurs when all the stages of counting means 16 include a binary-one (the count before all the stages become binary-zeros).

Referring to FIG. 2a, assume that the counter has been programmed for a slow crystal. For this case the count required before a timing signal occurs on leads 27, 28 and 30 is periodically shortened. Assume also that all the stages 17, 18, and 19 include binary-ones, and that at least one of the stages within stages 20 includes a binary-zero. At the next count as determined by the $\phi_1$ signal, a binary-one will be shifted into the first stage of stages 20. When this occurs a signal is produced on lines 27 and 28. No signal occurs on line 30 since at least one of the stages of stages 20 includes a binary-zero. The signal on line 28 causes a predetermined digital number to be loaded into the five stages 17. Time 117 of FIG. 2a represents the time at which all the stages of stages 17, 18 and 19 include binary-ones. (The binary numbers to the left and right of lines 118 and 119, and like lines, represent the binary contents of the stages 17.) At time 117 the binary number 00011 (the assumed binary number needed to correct the frequency deviation of the oscillator 12) becomes the count in stages 17. The other stages 18 and 19 restart with binary-zeros. After this occurs a shortened count 120 takes place since two of the stages of stages 17 were not set to binary-zeros. Eight seconds later all the stages 17, 18 and 19 will again include binary-ones (time 121) and when the ⅛T signal appears the binary number 00011 will again be loaded into stages 17. Thus a shortened count occurs every eight seconds.

When all of the stages within counting means 16 include binary-ones, a signal appears on line 30. This is shown in FIG. 2a at time 122. This signal causes a different binary number to be loaded into stages 17. This number is shown at the end of line 123 as 10000 (again assuming a binary number needed to correct the output of oscillator 12). Thus, every 256 seconds the binary number 10000 is loaded into stage 17. As is apparent this latter number permits finer corrections than the corrections that occur every eight seconds. Note that when the 1/256T signal occurs, even though a signal is present on lines 28, the digital number 10000 is coupled to the stages 17. Where more accuracy is required additional stages beyond stages 20 may be employed to permit even finer corrections. For example, a third digital number could be coupled to stages 17 every 8192 seconds.

Referring to FIG. 2b assume that the counter of FIG. 1 has been programmed for a fast crystal oscillator. For this case counts must be added to correct for the faster oscillator frequency. Each time the ⅛T signal appears (assuming no 1/256T signal) a binary number from storage means 24 is loaded into the five stages 17. This number is shown on line 124 (time 129) as 11101, by way of example. As this occurs the interrupt means 22 blocks a carry from one stage to another thus preventing the stages 18 and 19 from restarting with binary-zeros. Counting then continues within stages 17, 18 and 19 for the period 125 of FIG. 2b until a ⅛T signal again occurs (time 126). When this signal occurs the stages 17, 18 and 19 are allowed to restart with binary zeros. Then a full count occurs as indicated by period 127. Eight seconds later when the ⅛T signal again occurs, the five stages 17 are preset to 11101, carry is blocked to stages 18 and 19, and when the count again reaches all binary-ones in stages 17, 18 and 19, these stages restart with binary-zeros for a full count.

When the 1/256T signal appears such as shown at time 128, a different binary number is coupled into the stages 17; this number is shown as 11100, by way of example. Then after period 130 all the stages of stages 17, 18, 19 and 20 restart with binary-zeros and a full count occurs. Toggling means are employed as will be described in more detail in conjunction with FIG. 3, to implement the logic necessary for the plus case shown in FIG. 2b.

Referring now to FIG. 3 the five stages of stages 17 (FIG. 1) are shown as stages 28, 29, 30, 31 and 32. The even logic stage 29 and the odd logic stage 30 are shown in detail. As previously mentioned consecutive odd-even logic is employed by the stages. The output of the fourth stage 31, line 76, is connected to the input of the fifth stage, line 77, through a block carry means 60. This means may be an ordinary switch or gating means for interrupting the flow of data from the fourth stage to the fifth stage (or between other stages). This block carry means 60 is employed as part of the interrupt means 22 of FIG. 1 to prevent restarting of the counter stages at time 129, and like times, as shown in FIG. 2b.

Each of the stages 28 through 32 are coupled by lines 26a through 26e, respectively, to a storage means. In FIG. 3 line 26c couples the storage means to stage 30. Like lines couple each of the other stages to similar storage circuits. The storage means is substantially controlled by a latch and logic means 86.

The input to the stage 29, line 38, is coupled to one input terminal of a NOR gate 40. The other input to this NOR gate is the output of a switch, which switch comprises transistors 56 and 57. The output of NOR gate 40 is coupled to the input of stage 30 via line 59, and to one input terminal of a NOR gate 42. The other input terminal of NOR gate 42 is coupled to the output of an AND gate 44. One input to this AND gate is line 38, and the other input is coupled to the input terminal of the NOR gate 40. The output of the NOR gate 42 is coupled to one of the two storage nodes of stage 29, node 46. Node 46 is coupled through a switch comprising transistors 50 and 51 and an inverter comprising transistors 53 and 54 to the other storage node in the stage, node 48. The gate of the p-channel transistor 50 is coupled to line 34 while the gate of the n-channel transistor 51 is coupled to line 34a. Line 34a is coupled to line 34 through an inverter 33. Lines 34 and 34a are driven by the timing signal $\bar{\phi}_{2N}$. The gate of the n-channel transistor 56 is coupled to line 14, while the gate of the p-channel transistor 57 is coupled to line 14a. Line 14a is coupled to the source of the $\phi_1$ timing signal through an inverter 36. Transistor 53 has its source terminal coupled to a source of potential and its drain terminal coupled to the drain terminal of transistor 54. The source terminal of transistor 54 is coupled to ground. The gates of transistors 53 and 54 are coupled to line 26b.

The $\bar{\phi}_{2N}$ signal is derived from the $\phi_2$ signal, line 15. This signal is the complement of the $\phi_2$ signal, except when the fuses are read, that is, when signals are coupled to lines 26a through 26e from the storage means. This signal prevents transistors 50 and 51 of stage 29, switch 70 of stage 30, and the equivalent switches in the other stages from conducting when the fuses are read.

The input to the odd logic stage 30, line 59, is coupled to one input terminal of the NAND gate 61 and to one input terminal of the OR gate 65. The other input terminals of both these gates are coupled to switch 72. The output of NAND gate 61 and the output of OR gate 65 are coupled to the input terminals of the NAND gate 63. The output of gate 61 is also coupled by line 74 to stage 31. The output of the NAND gate 63 is coupled to the storage node 67. This storage node is coupled to the other storage node of this stage, node 68, through a switch 70 and through the inverter 71. The gates associated with inverter 71 receive the stored data from the storage means via line 26C when switch 80 and either transistors 96 or 100 conduct. Node 68 is coupled to the switch 72 such that charge may flow from this node into the gates 61 and 65.

The stages 29 through 32 operate in a standard manner. However, care must be taken in examining the flow of data from one stage to the other because of the alternate odd-even logic of these stages. Assume for purposes of explanation that the inputs to the gates 40 and 44 of stage 29 are logically reversed to compensate for moving from the odd stage 28 to the even stage 29 and for the inversion of the data by transistors 53 and 54. If a signal is present on line 38 and a charge is stored on node 48 (binary-zeros inputs because of the reversals mentioned) a binary-zero is stored on node 46 and a binary-zero is communicated to the third stage 30. If a signal exists on line 38 or a charge is stored on node 48, but not both, (this corresponds to an input binary-one or a stored binary-one) a binary-one will be stored on node 46 and a binary-zero will be coupled to stage 30. If no signal is present on line 38, or no charge on node 48 (this is equivalent to an input binary-one and a stored binary-one) a carry occurs, that is, a binary-one is communicated to the third stage 30. A binary-zero is stored on node 46 for these inputs. Thus the stage 29 performs an ordinary counting function. Similarly a binary-one input to the third stage 30 is first stored on node 67 then brought to node 68 where it is summed with the next incoming signal on line 59. The result of this summation is either stored on node 67 or communicated to stage 31.

Referring to stage 30 when the fuses are read, that is, when the stored digital number is coupled to the stages 28 through 32, switch 80 conducts and a binary-one or binary-zero is stored on node 68. During this fuse reading cycle switch 70 does not conduct, as mentioned, thus the output of gate 63 does not interfere with the flow of date from the storage means. The interrupt function, referred to as the "block carry" and the fuse read function are controlled by the bistable circuits 83 and 84, respectively. These circuits are reset at terminal R, and set to the signal coupled to terminal D on the rising edge of the timing signal coupled to terminal C. The C terminals of circuits 83 and 84 are coupled to the $\frac{1}{4}$T timing signal, line 28. The $\bar{C}$ terminals are also coupled to this line through the inverter 115. The Q output of circuit 83 is coupled to one input terminal of AND gate 107. The $\bar{Q}$ terminal of this circuit is coupled to the D terminals of both circuits 83 and 84. The Q and $\bar{Q}$ outputs of the circuit 84 are coupled to the latch and logic means 86. The reset terminal of circuit 83 is coupled to the output of AND gate 106.

The plus/minus logic means 112 is coupled to fuses 109 and 110. This means determines whether a plus correction or minus correction is required, as a function of the state of the fuses 109 and 110. For the minus case an output signal is provided to one input terminal of gate 106 by means 112. For the plus case a signal is provided to the latch and logic means 114.

The AND gate 106 and the logic and control means 114 are coupled to the source of the $\phi_2$ signal, line 15. The output of the latch and logic means 114 is coupled to the other input terminal of the AND gate 107. The output of the AND gate 107 controls the block carry means 60. The latch and logic means 114 provides an output to gate 107 only for the plus case (fast crystal). The signal to gate 107 occurs with the rise in the $\frac{1}{4}$T signal and then drops after the $\phi_2$ signal drops, however, before the $\phi_1$ signal rises. Ordinary latching and logic circuits may be employed for means 114.

The latch and logic means 86 provides a signal on either line 87 or line 88 when the Q terminal of the bistable fuse read circuit 84 is high. If the $\frac{1}{4}$T signal is present and the 1/256T signal is not present, then an output signal is provided on line 87. This output signal is used to gate one of the stored binary numbers into the stages 28 through 32. If the 1/256T signal is present then the latch and logic means 86 provides a signal on line 88. This signal gates the other stored digital number into the stages 28 through 32. The latch and logic means 86 also provides an output signal on line 93 when $\phi_2$ is high if either the ⅛T or 1/256T signal are present, and if the Q terminal of circuit 84 is high.

The fuse reading circuitry for stage 30 permits reading of either fuse 102 or fuse 103. Both fuses 102 and 103 are coupled to ground through the n-channel transistor 97. The gate of this transistor is coupled to $V_{DD}$. The other terminal of fuse 102 is coupled to node 116 through an n-channel transistor 96. The gate of this transistor receives a signal from line 87. Similarly, the other terminal of fuse 103 is coupled to node 116 through the n-channel transistor 100. Node 116 is coupled to an inverter comprising transistors 91 and 92. The source terminal of transistor 91 is coupled to $V_{DD}$ while the source terminal of transistor 92 is coupled to ground. The gates of transistors 91 and 92 are coupled to line 93. Node 116 is coupled to the line 26c through a switch 80. The gate of the n-channel transistor of this switch is coupled to line 93, the p-channel transistor of this switch receives the same signal after the signal passes through inverter 81.

As will be appreciated there are two fuses associated with each of the other stages 28 through 32. Thus two 5-bit binary numbers may be stored by these fuses. These fuses are either open (blown) or provide a path to ground through transistor 97. The circuits employed for programming the fuses, that is, for blowing the fuses are not shown. Ordinary circuits may be employed for this purpose. While in the presently preferred embodiment fuses are employed for storing binary data, other programmable devices may be used such as the floating gate devices frequently used in programmable read-only memories. In the presently preferred embodiment an inverter is included in every other line coupling the fuse reading circuits with the stages of the counter (lines 26a through 26e). These inverters are used to compensate for the alternate odd-even logic employed by the stages. This prevents alternate binary-ones and zeros from being coupled to the stages when all the fuses are intact.

Assume that the fuses are to be read and in particular, that a signal exists on lines 87 and 93. If fuse 102 is intact node 116 is coupled to ground through transistors 96 and 97. Even though transistor 91 is conducting for this condition, since transistor 97 is considerably larger, it pulls node 116 to ground. On the other hand, if fuse 102 is blown node 116 is coupled to the source of the $V_{DD}$ potential through transistor 91. When the $\phi_2$ signal rises in potential, node 116 is coupled to the stage 30 through switch 80. If a signal exists on line 88, rather than line 87, then fuse 103 is read in a similar manner. This occurs, as mentioned, once every 256 seconds.

First the operation of the counter of FIG. 3 will be described for a slow crystal, that is, the minus case shown in FIG. 2a. This assumes that the frequency of the oscillator 12 of FIG. 1 has been measured and compared with the standard frequency and the appropriate fuses have been blown to provide the necessary corrections at the 8 second intervals and the 256 second intervals. Assume further that the count in the stages of the counter is not sufficient to provide either a ⅛T signal or a 1/256T signal, and that the $\overline{Q}$ output of the block carry circuit 83 is high and the Q output of the fuse read circuit 84 is high. Even though circuit 84 is in the "read position" latch and logic means 86 does not provide an output on either lines 87 or 88, since no signal is present on lines 28 and 30. Also since logic means 112 is set for the minus condition no signal from this means is coupled to the latch and logic means 114. For these conditions no output will occur from the gate 107, thus the carry cannot be blocked.

Assume now that the counting has continued to a point in time where all binary ones are present in the stages 17, 18 and 19 of FIG. 1. When the $\phi_1$ next occurs a ⅛T signal appears on line 28. This signal causes the block carry circuit 83 to change state. Since the $\overline{Q}$ terminal of circuit 83 was high at the time the ⅛T signal occured, the fuse read circuit 84 does not change state. The ⅛T signal applied to the latch and logic means 86 causes this means to provide a signal on line 87, thus fuse 102 is read. Depending upon the state of this fuse, node 116 is either brought to ground through transistor 97 or to $V_{DD}$ through transistor 91. However, since the $\phi_2$ signal is low, node 116 is not yet coupled to stage 30.

When the $\phi_2$ signal next occurs the conditions of the AND gate 106 are satisfied and the block carry circuit 83 is reset with its $\overline{Q}$ output high. No change occurs in the state of circuit 84. The signal on line 93 which is applied to the switch 80 causes the predetermined digital number stored by fuse 102, and like fuses to be shifted into the stages 28 through 32. (As presently implemented the ⅛T signal drops in potential when the $\phi_2$ signal falls). Since the block carry means 60 was not activated all the stages of stages 18 and 19 of FIG. 1 restart with binary-zeros, and the predetermined digital number becomes the count in stages 28 through 32. This corresponds to the times 117 of FIG. 2a. This sequence is repeated every 8 seconds until the 1/256T signal occurs. When the 1/256T signal occurs, a signal appears on line 88 (not line 87) and fuse 103, and like fuses, are read. This corresponds to time 122 of FIG. 2a.

Assume now that fuses 109 and 110 have been programmed for the plus case, that is, a fast crystal as described in conjunction with FIG. 2b. Furthermore, assume that fuses 102 and 103, and like fuses, have been programmed with the necessary correction. If the count in the counter is such that neither a ⅛T nor a 1/256T signal is present the $\overline{Q}$ outputs of circuits 83 and 84 are high. When the ⅛T signal occurs, both circuits 83 and 84 change state. This provides a signal to AND gate 107. A signal is also provided by latch and logic means 114 to the other terminal of this AND gate. The output of AND gate 107 causes the block carry means 60 to block the carry thus preventing the stages to the right of stage 31 from restarting with binary-zeros. Since the Q output of circuit 84 is high, when the $\phi_2$ signal occurs fuse 102, and like fuses, are read through switch 80, and like switches. This corresponds to time 129 shown in FIG. 2b. Note that as in the previous case, the $\overline{Q}_{2N}$ signal does not activate switch 70, and like switches, when the fuses are read.

After the next $\phi_2$ timing signal, but before the next $\phi_1$ signal, the output from latch and logic means 114 drops, removing the output from the gate 107 and thereby deactivating the block carry means 60. This allows signals to flow from stages 31 to 32. When the count again is sufficient to cause the generation of the ⅛T signal, this signal changes the state of the binary circuits 83 and 84 such that the $\overline{Q}$ outputs are high. This change of state removes one of the inputs to AND gate 107, thereby preventing the carry from being blocked between stages 31 and 32. Also the change in state of circuit 84 prevents the fuses from being read when the $\phi_2$ signal next occurs. This point in time is shown as time 126 in FIG. 2b. Following this a full count occurs as shown by period 127 in FIG. 2b and then after 8 seconds when the next ½T signal occurs the fuse 102, and like fuses, are again read. Thus the bistable circuits 83 and 84 act as toggling means for reading fuses and blocking the carry for alternate ½T signals. When the 1/256T signal appears fuses 103, and like fuses, are read in the same manner.

Thus, a counter particularly suited for use with a quartz crystal oscillator has been described. The counter permits compensation for both fast and slow crystal oscillators. Programmable fuses are provided on the integrated CMOS circuit to permit the counter to be programmed for a particular crystal. In the presently preferred embodiment the output of the quartz crystal oscillator may be corrected to ± 1ppm.

We claim:

1. A digital counter for providing compensated timing signals comprising:
    a frequency reference source;
    storage means for providing a predetermined digital number;
    a plurality of counter stages coupled to said frequency reference source for reducing the frequency of said source to a lower frequency, said plurality of counter stages including a first group of counter stages which are coupled to said storage means;
    interrupt means for interrupting the flow of signals through at least one of said plurality of counter stages;
    control means coupled to said interrupt means, said storage means, and said plurality of counter stages for controlling said interrupt means and said storage means such that the count in said first group of counter stages is selectively made a function of said predetermined number;
    said predetermined number causing lesser counting in said counter stages for a slow one of said frequency source and additional counting for a fast one of said frequency source, said predetermined number being introduced into said first group of stages when said interrupt means interrupts said flow of said signals;
    whereby compensation may be provided for a fast or a slow frequency source.

2. The digital counter defined by claim 1 wherein said control means is coupled to a stage of said plurality of stages which stage counts more significant bits than the bits counted by said first group of counter stages.

3. The digital counter defined by claim 2 wherein said frequency reference source comprises a quartz crystal oscillator.

4. The digital counter defined by claim 1 wherein said storage means provides a first predetermined number and a second predetermined number, and wherein said control means couples said first number to said first group of stages at a first frequency and said second number to said first group of stages at a second frequency, said first frequency being greater than said second frequency.

5. The digital counter defined by claim 4 wherein signals representative of said first and second frequencies are derived from stages of said plurality of counter stages which stages count more significant bits than said first group of stages.

6. The digital counter defined by claim 5 wherein a second group of stages of said plurality of stages is coupled between said first group of stages and said stages employed for deviation of said first and second frequency signals.

7. The digital counter defined by claim 6 wherein said frequency reference source comprises a quartz crystal oscillator.

8. The digital counter defined by claim 7 wherein said interrupt means includes toggling means for selectively preventing the flow of a binary digit from one stage to another stage of said plurality of stages.

9. A programmable digital counter for use with a quartz crystal oscillator comprising:
    a first group of counter stages coupled to said oscillator;
    programmable storage means for providing a predetermined digital number;
    a second group of counter stages coupled to said first group of counter stages, said second group of counter stages for counting more significant bits than said first group of counter stages and for providing a first timing signal;
    control means for selectively preventing the count in said second group of counter stages from resetting and for selectively coupling said predetermined digital number to said first group of counter stages such that additional counting occurs for a fast one of said oscillator, said control means coupled to receive said first timing signal;
    whereby said counter may be programmed to correct for a fast or a slow quartz crystal oscillator.

10. The counter defined by claim 9 wherein said counter includes CMOS devices.

11. The counter defined by claim 10 wherein said control means includes toggling means coupled to receive said first timing signal.

12. The counter defined by claim 11 wherein said control means selectively blocks the carry from one of said stages to another of said stages to present said count in said second group of stages from restarting.

13. The counter defined by claim 12 wherein said programmable storage means comprises a plurality of fuses.

14. The counter defined by claim 9 wherein said storage means provides a first digital number and a second digital number and wherein a third group of counter stages are employed, said third group of stages for counting more significant bits than said second group of stages and for providing a second timing signal, and wherein said control means is coupled to receive said second timing signal.

15. The counter defined by claim 14 wherein said counter is fabricated with CMOS devices as an integrated circuit.

16. The counter defined by claim 15 wherein said storage means includes a plurality of fuses.

17. The counter defined by claim 16 wherein said first, second and third group of stages employ alternate odd-even logic.

* * * * *